June 26, 1973 H. F. LOCKWOOD ET AL 3,741 825
METHOD OF DEPOSITING AN EPITAXIAL SEMICONDUCTOR LAYER FROM THE LIQUID PHASE
Filed July 8, 1971
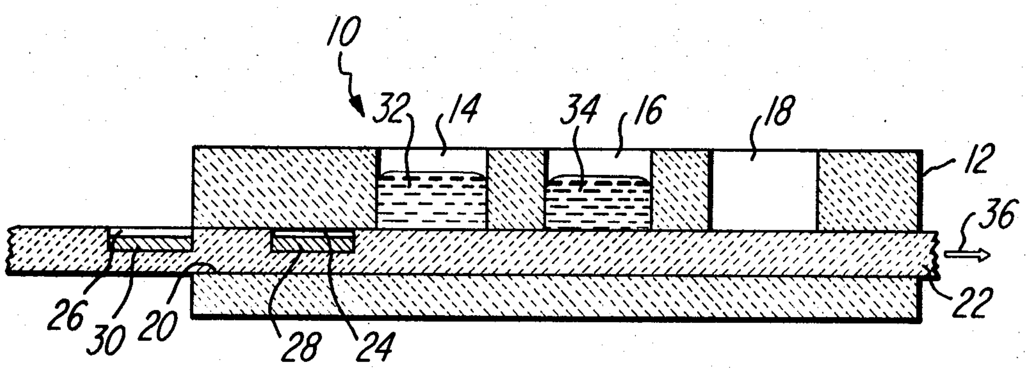
INVENTORS
Harry F. Lockwood &
Michael Ettenberg
BY Donald S. Cohen
ATTORNEY

United States Patent Office 3,741,825

Patented June 26, 1973

3,741,825

METHOD OF DEPOSITING AN EPITAXIAL SEMICONDUCTOR LAYER FROM THE LIQUID PHASE

Harry Francis Lockwood, New York, N.Y., and Michael Ettenberg, Freehold, N.J., assignors to RCA Corporation Filed July 8, 1971, Ser. No. 160,608

Int. Cl. H01l 7/38

U.S. Cl. 148—171 10 Claims

ABSTRACT OF THE DISCLOSURE

One or more epitaxial layers of a semiconductor material are deposited on a substrate by providing for each epitaxial layer to be deposited a separate solution of a semiconductor material dissolved in a molten metal solvent with each solution being unsaturated with the semiconductor material. A body of the semiconductor material is brought into contact with the solution and some of the body is dissolved in the solution so as to exactly saturate the solution. The body is then removed from the exactly saturated solution and the substrate brought into contact with the solution. The solution is cooled to deposit the epitaxial layer on the substrate. To deposit a plurality of epitaxial layers on the substrate, the substrate is successively brought into contact with each solution with the body of semiconductor material preceding the substrate into each solution so that each solution is exactly saturated with the semiconductor material when the substrate is brought into the solution.

BACKGROUND OF THE INVENTION

The invention herein disclosed was made in the course of or under a contract or subcontract thereunder with the Department of the Army.

The present invention relates to a method of depositing an epitaxial semiconductor layer from the liquid phase, and more particularly to such a method wherein the deposition is from an exactly saturated solution.

A technique which has come into use for making certain types of semiconductor devices, particularly semiconductor devices made of the Group III–V semiconductor materials and their alloys, such as light emitting devices and transferred electron devices is known as "liquid phase epitaxy." Liquid phase epitaxy is a method for depositing an epitaxial layer of a single crystalline semiconductor material on a substrate wherein a surface of the substrate is brought into contact with a solution of a semiconductive material dissolved in a molten metal solvent, the solution is cooled so that a portion of the semiconductor material in the solution precipitates and deposits on the substrate as an epitaxial layer, and the remainder of the solution is removed from the substrate. The solution may also contain a conductivity modifier which deposits with the semiconductor material to provide an epitaxial layer of a desired conductivity type. Two or more epitaxial layers can be deposited one on top of the other to form a semiconductor device of a desired construction including a semiconductor device having a PN junction between adjacent epitaxial layers of opposite conductivity type.

U.S. Pat. No. 3,565,702 to H. Nelson issued Feb. 23, 1971 entitled "Depositing Successive Epitaxial Semiconductive Layers From The Liquid Phase" describes a method and apparatus for depositing one or more epitaxial layers by liquid phase epitaxy and is particularly useful for depositing a plurality of epitaxial layers in succession. The apparatus includes a furnace boat of a refractory material having a plurality of spaced wells in its top surface and a slide of a refractory material movable in a passage which extends across the bottom of the wells. In the use of this apparatus, a solution is provided in a well and a substrate is placed in a recess in the slide. The slide is then moved to bring the substrate into the bottom of the well so that the surface of the substrate is brought into contact with the solution. When the epitaxial layer is deposited on the substrate, the slide is moved to carry the substrate out of the well. To deposit a plurality of epitaxial layers on the substrate, separate solutions are provided in separate wells and the substrate is carried by the slide to each of the wells in succession to deposit the epitaxial layers on the substrate.

In the use of liquid phase epitaxy, it is desirable that the deposition solution be exactly saturated with the semiconductor material at the temperature that the deposition takes place. If the solution is oversaturated with the semiconductor material, the solution will contain solid particles of the semiconductor material which often results in poor crystalline quality of the deposited epitaxial layer. If the solution is unsaturated with the semiconductor material the substrate when introduced into solution will dissolve in the solution in an uncontrollable way. This will result in poor planarity of the deposited layer. To achieve exact saturation of the solution at the deposition temperature by controlling the proportions of the ingredients originally used to form the solution is difficult since slight variations in the temperature will change the solubility of the solution. This becomes even more difficult when depositing a plurality of epitaxial layers in succession from a plurality of solutions as described in Pat. No. 3,565,702 since each layer is deposited at a different temperature.

SUMMARY OF THE INVENTION

An epitaxial layer of single crystalline semiconductor material is deposited on a substrate by providing a solution of the semiconductor material in a molten metallic solvent. A body of the semiconductor material is brought into contact with the solution so as to saturate the solution with the semiconductor material. The body is removed from the solution and a surface of the substrate is brought into contact with the solution. The solution is cooled to deposit the epitaxial layer on the substrate.

BRIEF DESCRIPTION OF DRAWING

The figure of the drawing is a cross-sectional view of an apparatus suitable for carrying out the method of the present invention.

DETAILED DESCRIPTION

Referring to the drawing, an apparatus suitable for carrying out the method of the present invention is generally designated as 10. The apparatus 10 comprises a refractory furnace boat 12 of an inert material, such as graphite. The bolt 12 has three, spaced wells 14, 16 and and 18 in its upper surface. A passage 20 extends longitudinally through the boat 12 from one end to the other end and extends across the bottom of the wells 14, 16 and 18. A slide 22 of a refractory material, such as graphite, movably extends through the passage 20 so that the top surface of the slide forms the bottom surface of the wells 14, 16 and 18. The slide 22 has a pair of spaced recesses 24 and 26 in its upper surface adjacent one end of the slide. The recesses 24 and 26 are spaced apart a distance substantially equal to the spacing between adjacent wells. The recess 24 is adapted to receive a body 28 of a semiconductor material, and the recess 26 is adapted to receive a flat substrate 30 on which the epitaxial layer or layers are to be deposited. The recess 26 is large enough to allow the substrate 30 to lie flat therein.

To carry out the method of the present invention, a first charge is placed in the well 14 and a second charge is placed in the well 16. Each of the charges is a mixture of the semiconductor material of the epitaxial layer to be deposited, a metal solvent for the semiconductor material and, if the epitaxial layer is to be of a particular conductivity type, a conductivity modifier. For example, to deposit epitaxial layers of gallium arsenide, the semiconductor material would be gallium arsenide, the metal solvent would be gallium, and the conductivity modifier could be either tellurium or tin for an N type layer, or zinc, germanium or magnesium for a P type layer. The proportions of the ingredients of each of the charges is such that when the metal solvent is melted to dissolve the semiconductor material, the solution will be unsaturated with the semiconductor material. The ingredients of the charges would be present in the mixture in granulated solid form at room temperature. A body 26 of the same semiconductor material as contained in the charges is placed in the recess 24, and a substrate 30 of a material suitable for epitaxial deposition is placed in the recess 26.

The loaded furnace boat 12 is then placed in a furnace tube (not shown) and a flow of high purity hydrogen is provided through the furnace tube and over the furnace boat 12. The heating means for the furnace tube is turned on to heat the contents of the furnace boat 12 to a temperature above the melting temperature of the ingredients of the charges, for example between 800° C. to 950° C. for GaAlAs or GaAs. This temperature is maintained long enough to insure complete melting and homogenization of the ingredients of the charges. Thus, the first charge becomes a first solution 32 of the semiconductor material and the conductivity modifier in the molten metal solvent, and the second charge becomes a second solution 34 of the semiconductor material and the conductivity modifier in the molten metal solvent.

The slide 22 is then moved in the direction of the arrow 36 until the semiconductor material body 28 is within the well 14. This brings the body 28 into contact with the first solution 32. Since the first solution 32 is unsaturated with the semiconductor material, some of the semiconductor material of the body 28 will dissolve in the molten metal solvent until the first solution is exactly saturated with the semiconductor material. The slide 22 is then again moved in the direction of the arrow 36 until the body 28 is within the well 16. This brings the body 28 into contact with the second solution 34. Since the second solution 34 is also unsaturated with the semiconductor material, some of the semiconductor material of the body 28 will dissolve in the molten metal solvent until the second solution is also exactly saturated with the semiconductor material.

Since the recess 26 which contains the substrate 30 is spaced from the recess 24 which contains the body 28 a distance equal to the spacing between adjacent wells, when the body 28 is moved from the first well 14 to the second well 16, the substrate 30 is simultaneously moved into the first well 14. This brings the surface of the substrate 30 into contact with the first solution 32 which is now exactly saturated with the smiconductor material. The heating means for the furnace tube is then turned off to cool the furnace boat 12 and its contents. Cooling of the exactly saturated first solution 32 causes some of the semiconductor material in the first solution 32 to precipitate and deposit on the surface of the wafer 30 to form a first epitaxial layer. During the deposition of the semiconductor material some of the conductivity modifiers in the first solution 32 become incorporated in the lattice of the first epitaxial layer to provide the first epitaxial layer with a desired conductivity type.

Cooling of the first solution 32 to deposit the epitaxial layer on the substrate 30 also cools the second solution 34. Since the second solution 34 is also exactly saturated with the semiconductor material the cooling of the second solution will cause some of the semiconductor material in the second solution 34 to precipitate and deposit back on the body 28. This maintains the second solution 34 exactly saturated with the semiconductor material even though the temperature of the solution has been lowered. The slide 22 is now again moved in the direction of the arrow 36 to move the substrate 30 with the first epitaxial layer thereon from the first well 14 into the second well 16. This brings the surface of the first epitaxial layer into contact with the second solution 34 which is exactly saturated with the semiconductor material at the then temperature of the solution. Further cooling of the furnace boat 12 and its contents causes some of the semiconductor material in the exactly saturated second solution 34 to precipitate and deposit on the first epitaxial layer to form a second epitaxial layer. Also, some of the conductivity modifier in the second solution 34 becomes incorporated in the lattice of the second epitaxial layer to provide the second epitaxial layer with a desired conductivity type. The slide 22 is then again moved in the direction of the arrow 36 to move the substrate 30 with the two epitaxial layers thereon from the well 16 to the empty well 18 where the substrate can be removed from the slide.

Although the method of the present invention has been described with regard to depositing two successive epitaxial layers, it can be used to deposit either a single epitaxial layer or more than two epitaxial layers. To deposit a single epitaxial layer, only one solution is used with the body 28 being brought into contact with the solution first so as to exactly saturate the solution and then the substrate is brought into contact with the exactly saturated solution to deposit the epitaxial layer on the substrate. To deposit more than two epitaxial layers on the substrate, the furnace boat 12 is provided with additional wells, so that there is provided a separate well for each solution from which an epitaxial layer is to be deposited. As the slide 22 is moved to carry the substrate 30 from one well to the next so as to successively deposit the epitaxial layers on the substrate, the body 28 precedes the substrate 30 so as to bring each solution to exact saturation and maintain such exact saturation until the substrate 30 is brought into contact with the solution.

Thus, in the method of the present invention, the body 28 of the semiconductor material serves as a source of the semiconductor material to bring each solution to an exact saturation of the semiconductor material and to maintain the solution exactly saturated until the substrate is brought into contact with the solution even if the temperature of the solution changes. The substrate 30 is brought into contact with each solution immediately following the removal of the body 28 so that the deposition of the epitaxial layer on the substrate is from an exactly saturated solution. Thus, each epitaxial layer deposited is of good crystalline quality and good planarity. Also, this method eliminates the need for critical control of the amount of the semiconductor material included in the original change forming each solution as long as the amount is less than required to saturate the solution since the body 28 will also add to each solution just the right amount of the semiconductor material to exactly saturate the solution.

We claim:

1. A method of depositing on a substrate an epitaxial layer of single crystalline semiconductor material comprising the steps of providing a solution of a semiconductor material dissolved in a molten metallic solvent, bringing a body of the semiconductor material into contact with the solution so as to saturate the solution with the semiconductor material, removing said body from the solution, bringing a surface of a substrate into contact with the solution, and cooling said solution sufficiently to deposit an epitaxial layer of the semiconductor material on said substrate.

2. The method of claim 1 in which the solution as originally provided is unsaturated with the semiconductor material.

3. A method of depositing on a substrate two epitaxial layers of single crystalline semiconductor materials in succession comprising the steps of providing first and second solutions of a semiconductor material dissolved in a molten metallic solvent, bringing a body of the semiconductor material into contact with the first solution so as to saturate the first solution with the semiconductor material, removing said body from the saturated first solution and bringing said body into contact with the second solution so as to saturate the second solution with the semiconductor material, substantially simultaneously with the removal of the body from the saturated first solution bringing a surface of the substrate into contact with the saturated first solution, cooling said saturated first solution sufficiently to deposit a first epitaxial layer of the semiconductor material on the substrate, then removing said body from the saturated second solution and substantially simultaneously bringing the surface of the first epitaxial layer into contact with the saturated second solution, and cooling said saturated second solution sufficiently to deposit a second epitaxial layer of the semiconductor material on said first epitaxial layer.

4. The method of claim 3 in which each of the solutions as originally provided is unsaturated with the semiconductor material.

5. The method of claim 4 in which at the same time that the first solution is cooled to deposit the first epitaxial layer on the substrate the second solution is also cooled the same amount so as to deposit some of the semiconductor material in the second solution on the body and maintain the second solution saturated with the semiconductor material.

6. A method of depositing on a substrate a plurality of epitaxial layers of single crystalline semiconductor material in succession using a furnace boat having a plurality of spaced wells in a surface thereof comprising the steps of providing in each of the wells of the furnace boat a separate solution of a semiconductor material dissolved in a molten metallic solvent, bringing a body of the semiconductor material into contact with each solution in succession so as to successively exactly saturate each solution with the semiconductor material, bringing the substrate into each of the exactly saturated solutions in succession, while the substrate is in each of the exactly saturated solutions, cooling said solution to deposit an epitaxial layer of the semiconductor material from said solution on said substrate.

7. The method of claim 6 in which the substrate is brought into each exactly saturated solution substantially simultaneously with the removal of the body from the solution.

8. The method of claim 7 in which each of the solutions are originally provided is unsaturated with the semiconductor material.

9. The method of claim 8 in which the boat and its contents are cooled starting at a time after the substrate is brought into the first solution, and when the substrate is in a solution having an epitaxial layer deposited thereon the body is in the next solution so as to maintain the next solution in exactly saturated condition.

10. The method of claim 9 in which the body and the substrate are mounted in spaced relation on a slide which movably extends through the boat and across the bottoms of the wells and the body and substrate are successively brought into the solutions by moving the slide with the body preceding the substrate.

References Cited

UNITED STATES PATENTS

| | | | |
|---|---|---|---|
| 3,565,702 | 2/1971 | Nelson | 148—172 |
| 3,607,463 | 9/1971 | Kinoshita et al. | 148—171 |

GEORGE T. OZAKI, Primary Examiner

U.S. Cl. X.R.

148—172, 1.5; 117—201; 252—62.3 GA; 118—415